(12) United States Patent
Walberg et al.

(10) Patent No.: US 7,824,963 B2
(45) Date of Patent: Nov. 2, 2010

(54) INKJET PRINTED LEADFRAME

(75) Inventors: Randall L. Walberg, Campbell, CA (US); Luu T. Nguyen, San Jose, CA (US); Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/626,440

(22) Filed: Nov. 25, 2009

(65) Prior Publication Data
US 2010/0072613 A1      Mar. 25, 2010

Related U.S. Application Data

(62) Division of application No. 12/110,991, filed on Apr. 28, 2008, now Pat. No. 7,667,304.

(51) Int. Cl.
*H01L 21/44* (2006.01)
*H01L 23/495* (2006.01)

(52) U.S. Cl. ........................ 438/111; 257/676
(58) Field of Classification Search ............... 438/111, 438/123, 610, 614; 257/676, 781
See application file for complete search history.

(56) References Cited

U.S. PATENT DOCUMENTS

| | | | |
|---|---|---|---|
| 6,045,942 A * | 4/2000 | Miekka et al. | 429/124 |
| 6,664,615 B1 | 12/2003 | Bayan et al. | |
| 2009/0020829 A1 * | 1/2009 | Chandra et al. | 257/384 |
| 2009/0267216 A1 | 10/2009 | Walberg et al. | |
| 2010/0022078 A1 * | 1/2010 | Rockenberger et al. | 438/585 |

* cited by examiner

*Primary Examiner*—Calvin Lee
(74) *Attorney, Agent, or Firm*—Beyer Law Group LLP

(57) ABSTRACT

Apparatuses and methods for inkjet printing electrical interconnect patterns such as leadframes for integrated circuit devices are disclosed. An apparatus for packaging includes a thin substrate adapted for high temperature processing, and an attach pad and contact regions that are inkjet printed to the thin substrate using a metallic nanoink. The nanoink is then cured to remove liquid content. The residual metallic leadframe or electrical interconnect pattern has a substantially consistent thickness of about 10 to 50 microns or less. An associated panel assembly includes a conductive substrate panel having multiple separate device arrays comprising numerous electrical interconnect patterns each, a plurality of integrated circuit devices mounted on the conductive substrate panel, and a molded cap that encapsulates the integrated circuit devices and associated electrical interconnect patterns. The molded cap is of substantially uniform thickness over each separate device array, and extends into the space between separate device arrays.

13 Claims, 6 Drawing Sheets

INKJET PRINTED LEADFRAME

CROSS REFERENCE TO RELATED APPLICATION

This application is a divisional of and claims priority to commonly owned and co-pending U.S. patent application Ser. No. 12/110,991, filed Apr. 28, 2008, and entitled "INKJET PRINTED LEADFRAMES," which is incorporated herein by reference in its entirety and for all purposes.

TECHNICAL FIELD

The present invention relates generally to the packaging of integrated circuit devices, and more particularly to certain leadframe type integrated circuit packages and various methods of creation thereof.

BACKGROUND

Leadframes are one well known way of providing electrical interconnects for an integrated circuit ("IC") device in the creation of a chip scale package ("CSP"). In general, leadframes and other forms of electrical interconnects can comprise metallic traces or "leads" that permit electrical communications to and from various electrical contact points on an associated die or other IC device. Although there are a variety of different types of electrical interconnects, and leadframes in particular, a leadless leadframe package ("LLP") is one example of a relatively recent IC package design that contemplates the use of a metal substrate in the formation of a CSP.

As shown in FIGS. 1A through 1C, a typical set of LLPs can involve the formation of a copper leadless leadframe strip or panel 10 that is patterned to define a plurality of device arrays or matrices 11 of individual semiconductor device areas or electrical interconnect patterns 12. Each device area 12 comprises an electrical interconnect pattern that includes a plurality of contact regions 13 arranged around the circumference of an attach pad 14. Fine tie bars 15 may also be used to support the contact regions 13 and attach pads 14, although such tie bars may be unnecessary in some LLP or other general leadframe designs. As shown, there are five separate device arrays 11 in panel 10, twelve individual device areas 12 in each device array 11, and ten contact regions 13 in each individual device area. However, it will be readily appreciated that any given panel may have more or fewer device arrays, that any given device array may have more or fewer individual electrical interconnect patterns, and that any given device area may have more or fewer contacts or contact regions, as may be desired for a particular design.

Panel 10 is typically formed by etching a relatively thin conductive metal layer, such as copper, into specific electrical interconnect patterns, as shown. Such a metal layer for panel 10 tends to have a thickness of about 100 to 300 microns, such that the entire finished panel is relatively thin, yet still has enough structural integrity to be transported about and processed without collapsing or breaking. Although the primary function of the various patterns, that being to provide electrical interconnects between components, can be accomplished with patterns that are substantially thinner than those in panel 10, the typical thicknesses of these panels are typically much larger, such that the panels are sturdy enough to be readily processed. One drawback of panels that are thicker than necessary for their primary function, however, is that additional material is used, which can drive up materials costs. The drawback of such added materials costs can be aggravated when such panels are made from more valuable or expensive metals, such as copper, silver and/or gold.

While many IC device leadframes and other electrical interconnect systems have worked well in the past, there is always a desire to provide improved and more cost effective processes for packaging IC devices.

SUMMARY

It is an advantage of the present invention to provide systems and methods for the creation of ultra-thin electrical interconnect patterns, such as leadframes, for the packaging of integrated circuit components. Such thin electrical interconnect patterns or leadframes can be created using an inkjet printer to print metallic nanoinks to a thin substrate, which can then be used as part of an overall packaging process. The thickness of each electrical interconnect pattern or leadframe component can be readily controlled by way of such an inkjet creation process, and the thinness of such components results in the use of less metallic materials, thus reducing material costs.

In various embodiments of the present invention, a package for an integrated circuit device can include an attach pad printed to a thin substrate and adapted to be coupled to an integrated circuit device, and a plurality of contact regions printed to the thin substrate and adapted to be electrically coupled to electrical contacts on the integrated circuit device. The thin substrate can be adapted for high temperature processing, and can be a sacrificial component that is not a part of the final package after it is removed from the remainder of the package. The plurality of contact regions can be arranged around the circumference of the attach pad, such as in a leadframe or leadless leadframe formation. In particular, the attach pad and plurality of contact regions can have a substantially consistent thickness of about 75 microns or less, 50 microns or less, 20 microns or less, or even 10 microns or less.

In various embodiments of the present invention, an integrated circuit device panel assembly can include a substrate panel having multiple separate device arrays comprising numerous electrical interconnect patterns each, a plurality of integrated circuit devices mounted on the substrate panel, and a molded cap that encapsulates the integrated circuit devices and associated electrical interconnect patterns. Each individual electrical interconnect pattern, which can be a leadframe, can couple to an associated integrated circuit device. The molded cap can be of substantially uniform thickness over each separate device array, and can also extend into the space between separate device arrays.

Various methods of manufacturing an electrical interconnect pattern for one or more integrated circuit devices are also disclosed. Process steps for such methods can include designing a layout for an electrical interconnect pattern, such as a leadframe, communicating said layout to an inkjet printer, moving a thin substrate adapted for high temperature processing past a printing component of the inkjet printer, dispensing a metallic nanoink from the inkjet printer onto the thin substrate in the form of said layout for the electrical interconnect pattern as the thin substrate moves past the printing component, and curing the nanoink, thereby driving off its liquid component, such that a substantially metallic residual electrical interconnect pattern remains on the thin substrate. In some embodiments, the thin substrate can be moved past said printing component using a reel to reel process.

Variations and features of one or more of the foregoing embodiments can be included in another embodiment, and additional variations and features can be used in any one of the foregoing embodiments, as may be desired. Such additional features may include the subject leadframe or interconnect pattern having a substantially consistent thickness of about 75 microns or less, 50 microns or less, 20 microns or less, or 10 microns or less. Further, a subject leadframe or interconnect pattern can be formed using metallic nanoinks comprising a fluid containing silver or copper particles from about 5 to 100 nanometers, wherein the fluid has a metallic percentage ranging from about 20 to 50 percent. An organometallic nanoink may also be used. In addition, the thickness of the molded cap between device arrays can be less than the thickness of the molded cap over the device arrays, so as to provide structural support to the overall panel when the thin substrate is removed.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for providing inkjet printed electrical interconnect packages. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

Figure 1A:
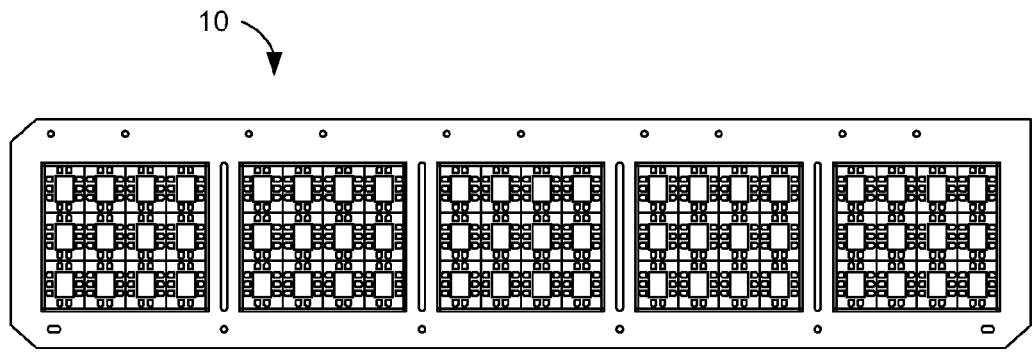
FIG. 1A illustrates in top plan view an exemplary leadless leadframe panel containing a plurality of device arrays, each having a plurality of electrical interconnect patterns.
Figure 1B:
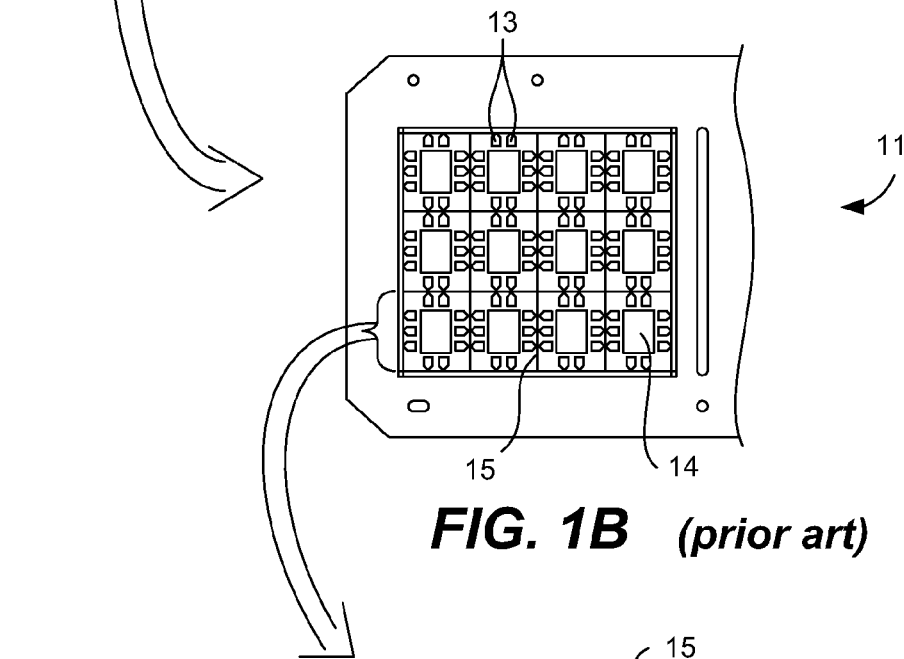
FIG. 1B illustrates in top plan view an exemplary device array from the leadless leadframe panel FIG. 1A.
Figure 1C:
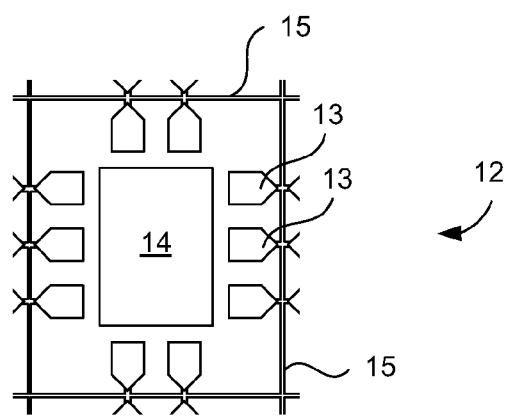
FIG. 1C illustrates in top plan view an exemplary electrical interconnect pattern from the device array of FIG. 1B.
Figure 2A:
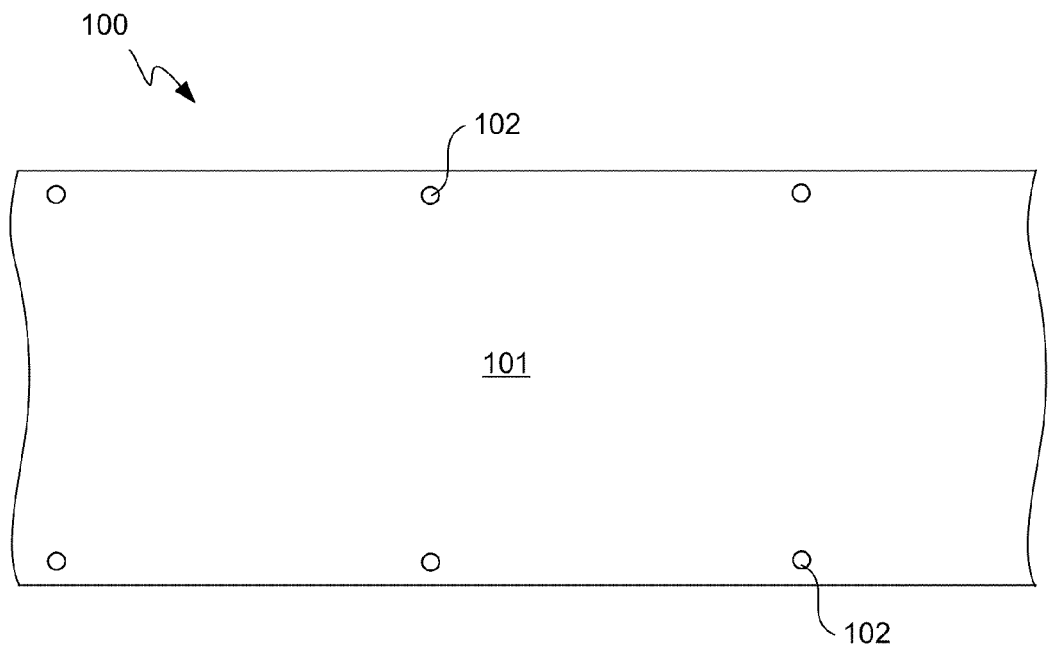
FIG. 2A illustrates in partial top plan view an exemplary thin substrate adapted for high temperature processing according to one embodiment of the present invention.

Referring first to FIG. 2A, an exemplary thin substrate adapted for high temperature processing according to one embodiment of the present invention is shown in partial top plan view. Thin substrate 100 can generally be comprised of an appropriate polyimide, polymer, high temperature paper, or other suitable material 101 that is able to withstand typical high temperature packaging processes. For example, a typical die attach and cure process might run at 150° C. for 30 minutes, a typical wire bonding process might run at 200° C. for 5 minutes, and a typical encapsulant molding process might run at 175° C. for 5 minutes. In addition to being able to withstand the foregoing temperatures and times, substrate 100 is also preferably formed from a material 101 to which metallic nanoinks may be readily printed and attached, but that is not overly sticky for such nanoinks. That is, nanoink electrical interconnect patterns will be printed to substrate 100 in an initial process phase, but this substrate will eventually be removed from these nanoink patterns as the patterns are left on the surface of a finished package at a later stage. Thus, thin substrate 100 must also be comprised of a material that is readily removable from a cured metallic nanoink pattern without disrupting the metallic nanoink pattern.

As shown, substrate 100 also has a plurality of regularly spaced index or locator holes 102 formed therein. Such locator holes 102 can be used as reference points for the formation of various components on the substrate, such as electrical interconnect patterns, dice, molding caps and the like. Further, locator holes 102 can also be used by roller pins and/or other guide pins or tabs to pull and/or guide a continuous and unbroken length of substrate 100 in a reel to reel based printing and curing process, as set forth herein.

Figure 2B:
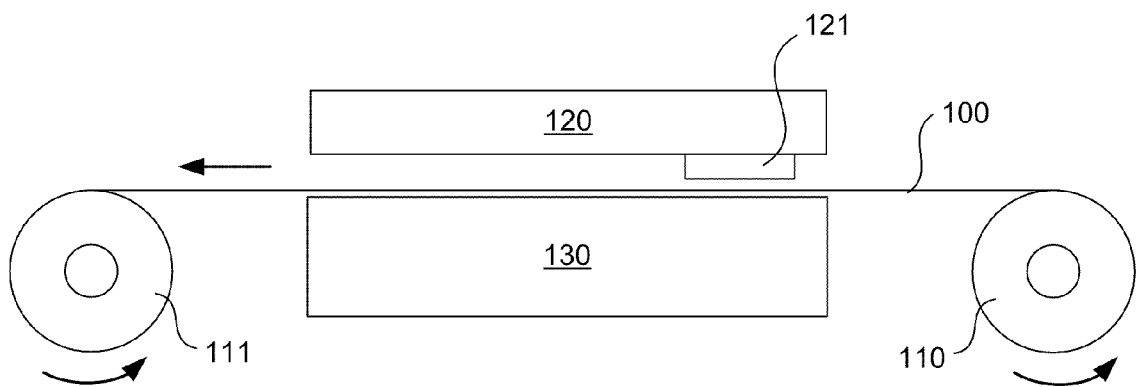
FIG. 2B illustrates in side cross-sectional view the thin substrate of FIG. 2A going through a reel to reel inkjet printing process according to one embodiment of the present invention.

Moving next to FIG. 2B, the thin substrate of FIG. 2A is shown going through a reel to reel inkjet printing process in side cross-sectional view. Substrate 100 can comprise a substantially blank material that is rolled up on an initial supply roll 110, such as a high temperature paper roll. Substrate 100 is then pulled off this supply roll and moved or otherwise processed past an inkjet printer 120 having a print head or other printing component 121. As substrate 100 passes by inkjet printer 120, the printing component 121 can print or otherwise dispense metallic nanoinks into designed layouts for leadframes or other electrical interconnect patterns onto the substrate. Platen 130 can be used to help guide and/or protect the thin substrate as it passes through the printing process, after which the printed substrate is then rolled up onto finishing roll 111. In various embodiments, platen 130 can be heated and/or have one or more alternative curing components coupled thereto, so as to facilitate a curing process for the freshly printed wet nanoinks on the substrate.

Metallic nanoinks used for such an inkjet printing process can be selected from any of a number of commercially available or customized nanoinks. One example of a commercial provider of such metallic nanoinks is Cima NanoTech of St. Paul, Minn. In various embodiments, such nanoinks can have minute copper, silver, palladium, platinum and/or gold particles mixed into a water-based or solvent-based formulation to be used for surface activation during plating. The overall nanoink composition may range from 20 to 50 percent metallic particle loading by weight, although other composition percentages might also be used. Smaller percentages of metal in the nanoink can result in a weaker final residual metal pattern, requiring multiple printing passes that will affect the fine printing resolution. Larger percentages of metal can result in an ink that is not as easily processed by many inkjet printers. Metal particles in a useful nanoink can range in size from a diameter of about 5 to 100 nanometers, although smaller or larger particle sizes might also be used. Other types of metals may also be used, although the metals listed here are thought to work well.

Inkjet printer 120 might be selected from any of a number of commercially available or customized inkjet printers. Alternatively, a customized inkjet printer can be designed to work for the specific nanoink to thin substrate printing processes set forth herein. One example of such a customized inkjet printer can be one specifically designed for manufacture by Dimatix, Inc. of Santa Clara, Calif. In further embodiments, a series of inkjet printers can be used, such as where several different distinct nanoinks are to be printed to substrate 100. Such different nanoinks may comprise different metals, may be printed in interactive patterns or layouts, and/or may be printed atop one other, such as after a cure process for each one.

Under any of the foregoing situations, it may be preferable to arrange the disclosed reel to reel process such that any wet printed nanoink is cured or otherwise at least partially dried prior to rerolling the finished electrical interconnect patterns onto finished roll 111, so as to prevent or minimize the running or distortion of any wet ink before contacting a substrate backside or other surface. As such, the use of a curing platen 130 can serve to dry or cure any water or solvent out of the printed nanoink while the substrate moves along the platen from reel to reel. In some embodiments, the length of a curing platen 130 can be specifically designed such that any newly printed and wet nanoink has a sufficient amount of time to be exposed thereto. In this manner, the fluid in the nanoink is then cured, outgassed or otherwise dried out as part of the ordinary moving and printing process of the continuous substrate 100 from reel to reel and past printing component 121. It will be readily appreciated that curing of a wet nanoink can be accomplished in any of a variety of ways, such as, for example, by way of a thermal, ultraviolet or photonic process.

As such, platen 130 may have heating components, ultraviolet light components and/or high energy light pulsing components, among other curing features. Of course, ultraviolet and phonetic energy sources would likely need to be directed from above the substrate, rather than from beneath it.

One advantage of inkjet printing a metallic nanoink layout for a leadframe or other electrical interconnect component to a substrate is that the thickness of such an item can be controlled and greatly reduced. Thicknesses for a leadframe or other electrical interconnect component printed in such a manner can generally be up to an order of magnitude thinner than thicknesses for an ordinary leadframe or similar component. For example, while a typical metal leadframe has a thickness on the order of 100 to 300 microns, a printed and cured metallic nanoink leadframe or other electrical interconnect pattern can have a thickness of about 10 to 75 microns. This thickness can range from 10 to 20 microns in some circumstances, and can be even less than 10 microns depending upon the nanoink composition and cure process used.

Figure 3A:
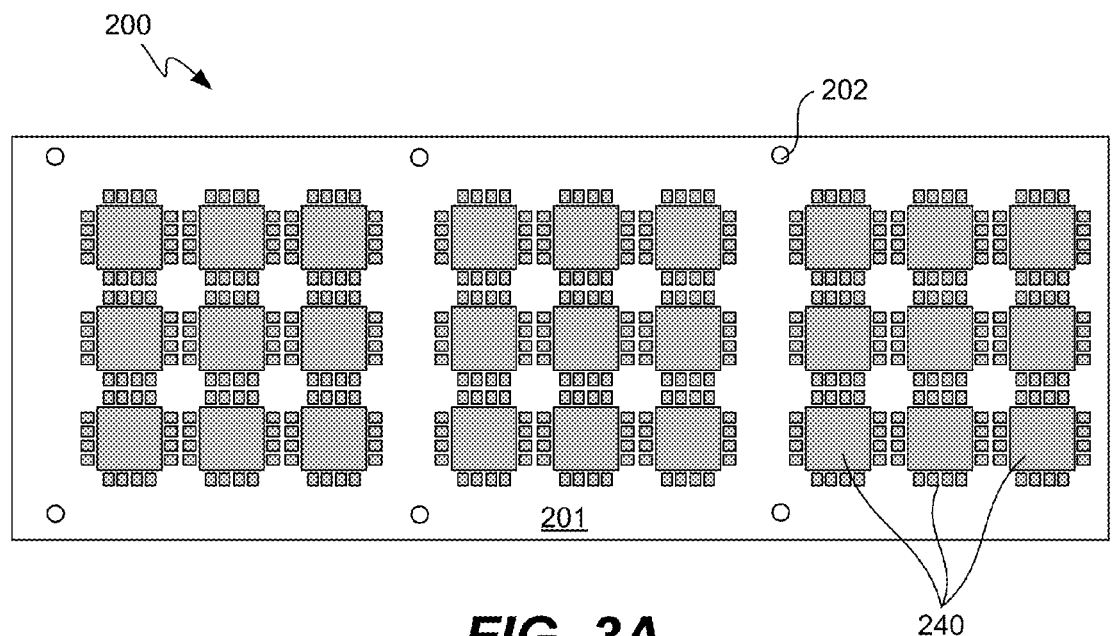
FIG. 3A illustrates in top plan view the thin substrate of FIG. 2B after having a plurality of exemplary electrical interconnect patterns inkjet printed thereto according to one embodiment of the present invention.

Continuing on to FIG. 3A a cut strip of the thin substrate of FIG. 2B is illustrated in top plan view after having a plurality of exemplary electrical interconnect patterns inkjet printed thereto. Similar to blank thin substrate 100, printed thin substrate 200 comprises material 201 and a plurality of index or locator holes 202. In addition, a plurality of leadframes or other electrical interconnect pattern components 240 have been printed thereto by way of an inkjet printing process using metallic nanoinks. As noted above, such metallic nanoinks can include conductive copper, silver and/or gold particles, and can be cured into a residual form such that substantially only these metal particles remain. Although shown as cut from a continuous substrate, cut strip 200 can just as well still be a part of the overall continuous printed substrate at this stage. In addition, although shown as having three separate device arrays, nine different device regions in each device array, and sixteen contact regions per device region, it will be appreciated that any other number and/or arrangement of these items can be used in a given design, as may be desired.

Figure 3B:
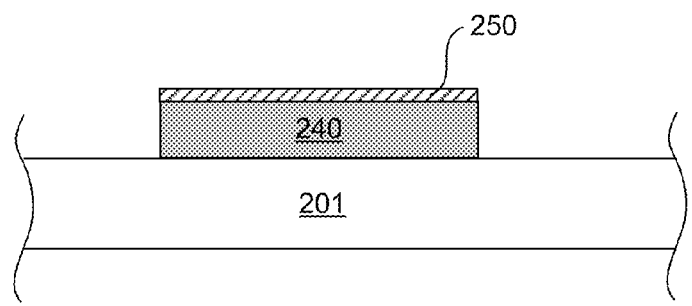
FIG. 3B illustrates in partial side cross-sectional view an exemplary individual electrical interconnect of FIG. 3A having a top layer added thereto in preparation for wire bonding according to one embodiment of the present invention.
Figure 3C:
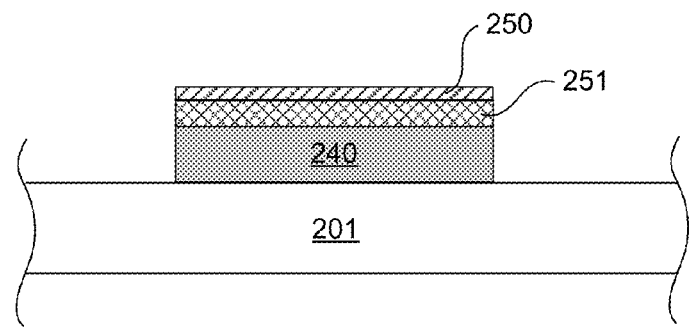
FIG. 3C illustrates in partial side cross-sectional view an exemplary individual electrical interconnect of FIG. 3A having two top layers added thereto in preparation for flip chip connecting according to one embodiment of the present invention.

FIGS. 3B and 3C each illustrate in partial side cross-sectional view a single exemplary individual electrical interconnect or component of FIG. 3A having one or more top layers added thereto in preparation for additional processing. In FIG. 3B, one layer is added for wire bonding, while in FIG. 3C, two layers are added in preparation for flip chip connecting. As shown, a printed electrical interconnect component 240, which can be an attach pad, contact region or the like, is situated atop substrate material 201. An ultra-thin metal layer 250 can then be flash formed atop component 240. Such a metal layer can have a thickness of about 0.1 microns or less, and can be formed from silver, gold, palladium, or any other metal suitable for wire bonding and/or flip chip lead usage. In the event of flip chip lead creation, as shown in FIG. 3C, an additional barrier metal middle layer 251 can be formed prior to forming the ultra-thin top metal layer 250. Such a middle barrier layer can have a thickness of about 1 micron, and can be formed from, for example, nickel or cobalt, among other suitable barrier layer metals.

Metal layers can be implemented via any suitable flash layer process, such as electroplating, for example. Alternatively, metal layers 250 and 251 might also be created by way of subsequent inkjet printing processes. For example, the roll to roll printer and platen setup of FIG. 2B might include one, two or more additional inkjet print heads or components, with sufficient curing platen between each printing component to allow for a suitable curing or drying out of a previous metallic nanoink printing prior to the inkjet printing of a subsequent different metallic nanoink. In this manner, each layer 240, 250, 251 of FIG. 3B or 3C can be inkjet printed using a suitable metallic nanoink inkjet and cure process. Alternatively, the substrate roll can be passed through one or more plating baths so that different metal layers can be added. These layers could be copper, gold, silver, palladium, or any of a variety of metals used as barriers (e.g., nickel, cobalt).

Figure 4A:
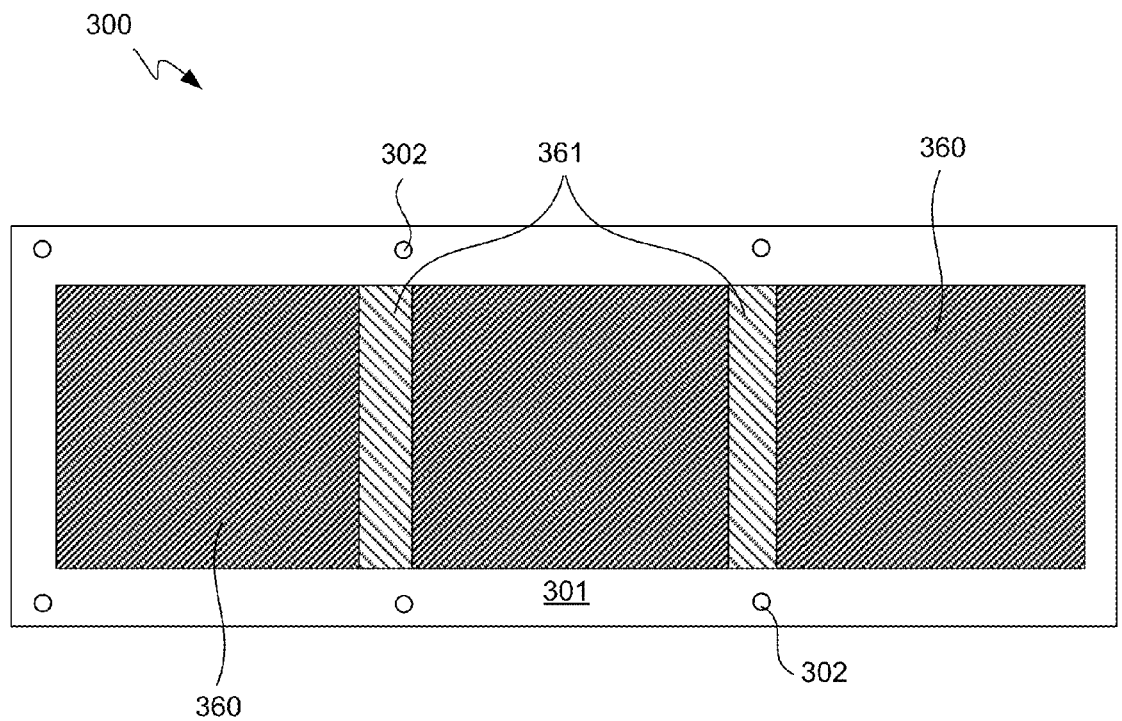
FIG. 4A illustrates in top plan view the thin substrate of FIG. 3A having been processed into an exemplary molded strip having integrated circuit devices and a molded cap formed thereupon according to one embodiment of the present invention.
Figure 4B:
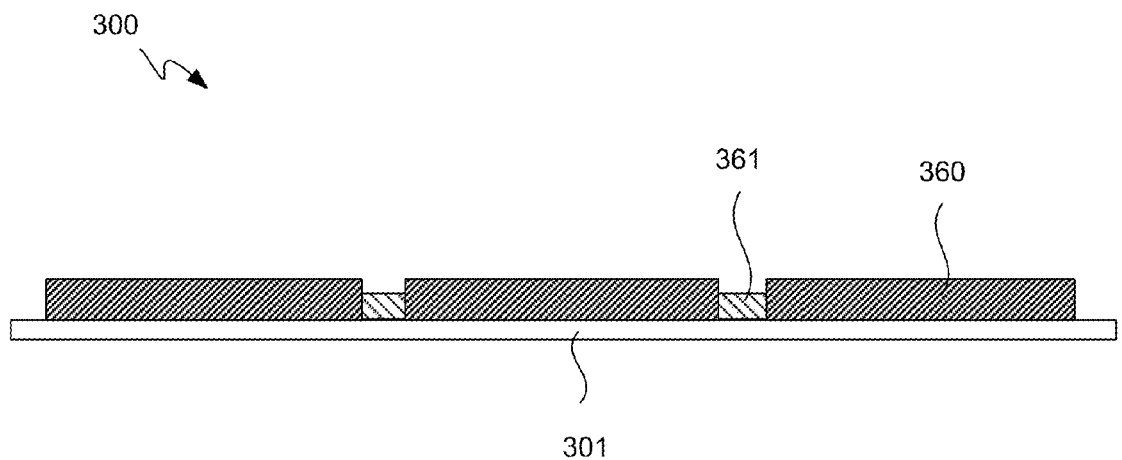
FIG. 4B illustrates in side elevation view the molded strip of FIG. 4A according to one embodiment of the present invention.

Turning now to FIGS. 4A and 4B, the cut substrate portion of FIG. 3A is shown in top plan and side elevation views after having been processed into an exemplary molded strip having integrated circuit devices and a molded cap formed thereupon. As shown, molded strip 300 can have on its outer edges index holes 302 and a fringe of still uncovered substrate material 301. Individual dice or integrated circuit devices have been formed atop and electrically connected within each device region, and an encapsulant or molded cap region 360 has been formed atop all integrated circuit devices and connections in each of the three separate device arrays. Further, additional encapsulant material has been formed in the molded cap regions or spaces 361 between separate device arrays, such that one continuous overall "molded cap" is created thereby.

Although a typical leadframe panel does not have added encapsulant in between separate device arrays, such a formation is preferable in the present situation where the layer for the leadframes or other electrical interconnect patterns is too thin to have enough structural integrity to support itself. Accordingly, a single "molded cap" comprising each of molded cap portions 360 and 361 is formed atop the entire molded strip or panel 300. Such a single molded cap provides support to the entire panel once the thin substrate is finally removed from the panel. Since encapsulant is only desired in the spaced regions 361 between device arrays in order to provide support for panel level transport and processing, the amount of encapsulant in these regions does not necessarily need to be as much as that which is desired for the more permanent encapsulant regions atop the packaged integrated circuit devices. As such, the thickness of the overall molded cap between device arrays can be less than the thickness of the molded cap over the actual device arrays, as shown in FIG. 4B.

Figure 5A:
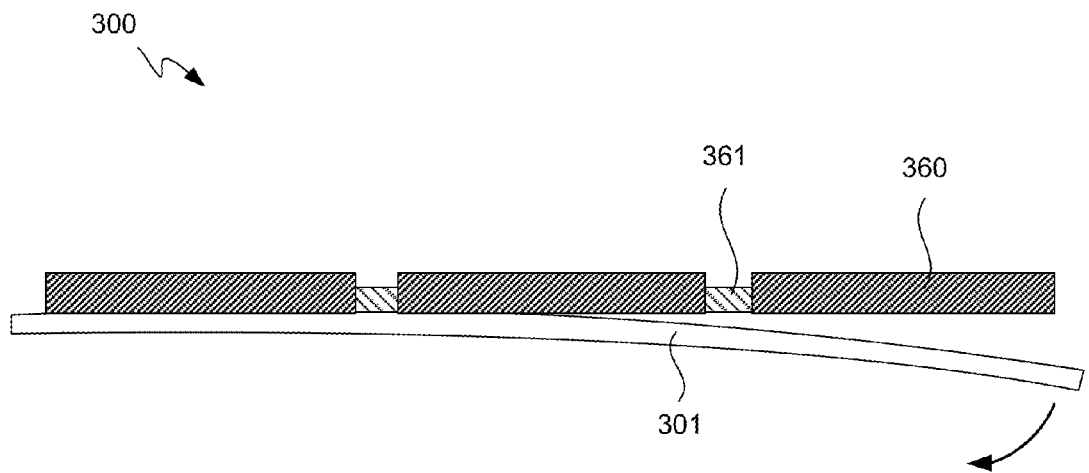
FIG. 5A illustrates in side elevation view the molded strip of FIG. 4B having the thin substrate being removed according to one embodiment of the present invention.
Figure 5B:
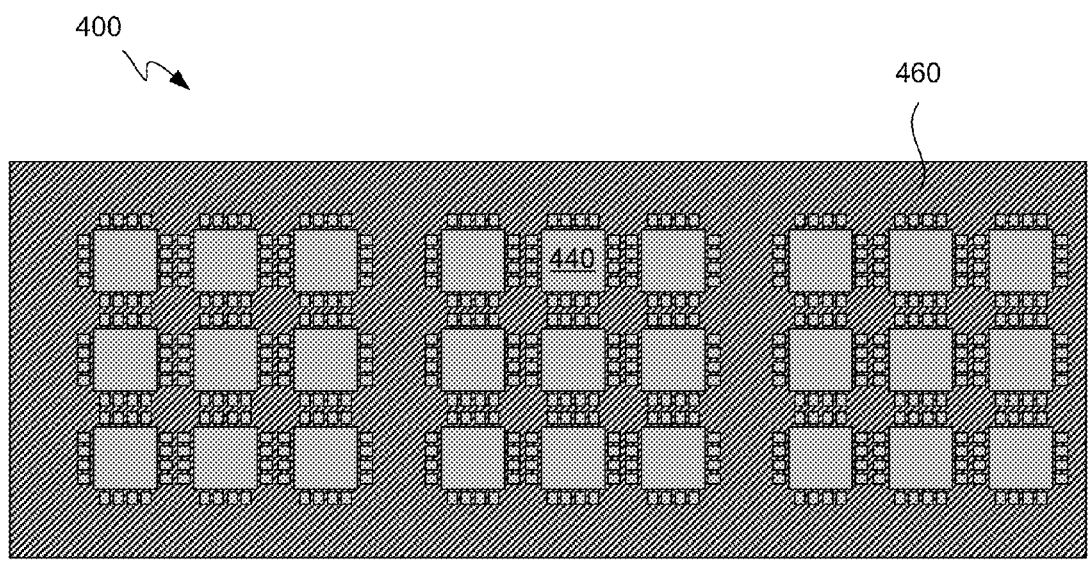
FIG. 5B illustrates in bottom plan view the molded strip of FIG. 5A with the thin substrate removed and the inkjet printed electrical interconnect patterns exposed thereby according to one embodiment of the present invention.

FIG. 5A illustrates the molded strip of FIG. 4B having the thin substrate 301 as being finally removed, and FIG. 5B depicts in bottom plan view the molded strip of FIG. 5A with the thin substrate as removed and the inkjet printed electrical interconnect patterns exposed thereby. As shown, the final removal of the thin substrate results in the various inkjet printed leadframes or other electrical interconnect patterns and components 440 remaining attached to their respective dice or integrated circuit devices underneath. The overall finished panel 400 comprised of encapsulant or molded cap 460, printed electrical interconnects 440 and underlying IC devices can then be singulated or sawn into individual packages as may be desired.

Figure 6:
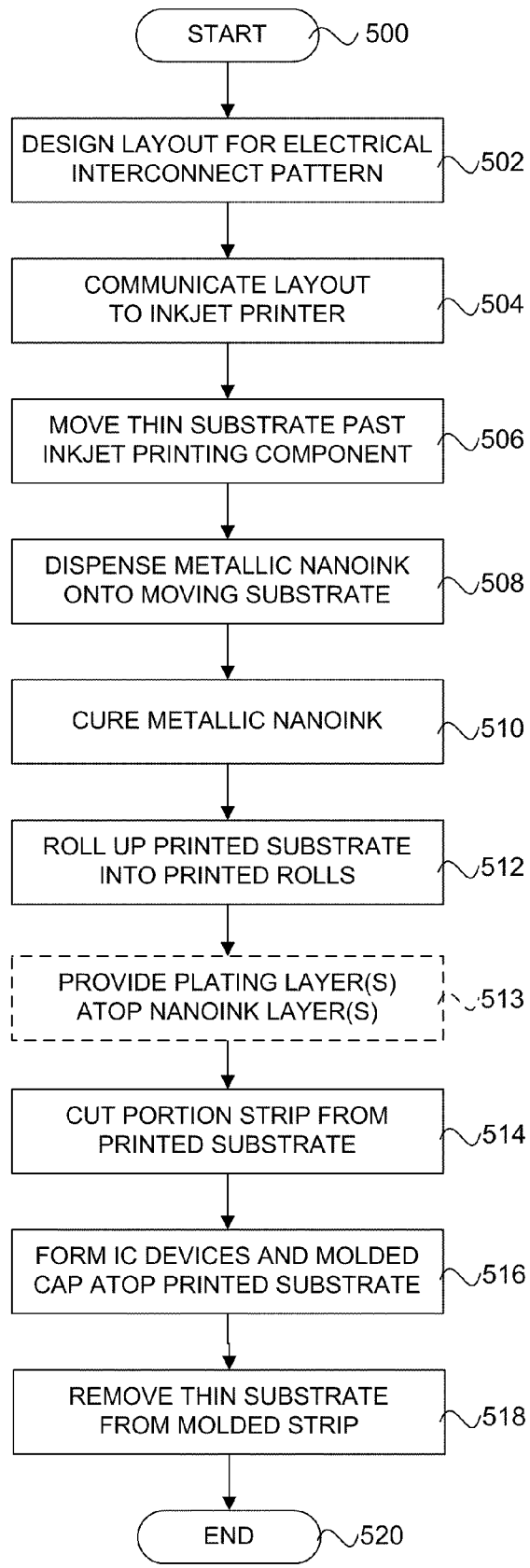
FIG. 6 illustrates a flowchart of one exemplary method of manufacturing an electrical interconnect pattern for one or more integrated circuit devices according to one embodiment of the present invention.

FIG. 6 illustrates a flowchart presenting one exemplary method of manufacturing the various packages of FIGS. 2A through 5B according to various embodiments of the present invention. It will be readily appreciated that the method and flowchart provided herein are merely exemplary, and that the present invention may be practiced in a wide variety of suitable ways. While the provided flowchart may be comprehensive in some respects, it will be readily understood that not every step provided is necessary, that other steps can be included, and that the order of steps might be rearranged as desired by a given manufacturer, as desired.

After start step 500, a layout for an electrical interconnect pattern can be designed at process step 502. As noted above, such an electrical interconnect pattern may be in the form of a leadframe, for example. At subsequent process step 504, the pattern layout is communicated to an inkjet printer. A thin substrate is then moved past a print head or other printing component of the inkjet printer at process step 506, and a metallic nanoink is printed or otherwise dispensed onto the moving thin substrate in the form of the designed layout at process step 508. Such a nanoink can be of a composition such as that described in greater detail above.

The printed nanoink is then cured, thereby driving off the water or other fluid solvent at process step 510, and the printed thin substrate can be rolled up into a printed roll for later use at process step 512. Printing using double, triple or more passes can be used to build up the thickness and composition of the metal stack. Alternatively, the roll can be passed through a plating line where the proper metal thickness can be deposited at a much faster speed.

As such, an optional plating step is shown as process step 513. Such a plating step may be performed in the order shown, or in any other suitable order, such as before rolling up the printed substrate into printed rolls (i.e., process step 512). Either electrolytic or electroless plating can be used, depending upon the metal and cap thickness desired. Where an electrolytic bath is used, the leadframe can preferably be designed with connecting bus lines or other similar components, so as to allow for proper current distribution and uniform plating thickness. With electroless plating, such items may be less desirable.

At process step 514, strips or portions can then be cut from the continuous printed substrate. Such strips or portions can be cut in lengths that correspond to appropriate panel sized lengths, for example. At process step 516, dice and/or other IC devices can then be formed atop the printed substrate strip, and a molded encapsulating cap can be added as well. Such a molded cap can be of the particular type described in greater detail above. The thin substrate can then be peeled off or otherwise removed at process step 518 to expose the printed electrical interconnect patterns, and the method then ends at end step 520.

As will be appreciated, the foregoing method can be made to reflect some or all details of the stages depicted in FIGS. 2A through 5B above. Furthermore, steps may be performed in a different order, as may be preferred. For example, printed substrates may be cured after a roll up process, and/or cutting the printed substrate into portion strips might also take place before a cure process. In addition, various steps may be performed at the printed substrate level over the panel level, or vice versa. In some embodiments, the use of various processes requiring a panel may be foregone in favor of other methods that do not require such a panel type manufacturing stage or process.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A method of manufacturing an integrated circuit device, comprising:

designing a layout for an electrical interconnect pattern adapted to connect external components with said integrated circuit device;

communicating said layout for said electrical interconnect pattern to an inkjet printer;

positioning a thin substrate proximate to a printing component of said inkjet printer;

printing a metallic nanoink from said inkjet printer onto said thin substrate in the form of said layout for said electrical interconnect pattern; and curing said metallic nanoink such that a substantially metallic residual remains on said thin substrate, wherein said electrical interconnect pattern is part of a panel containing multiple and separate arrays covered by a molded cap and having multiple packages each, wherein said molded cap is of substantially uniform thickness over each separate array of multiple packages, and wherein said molded cap extends between each separate array of multiple packages.

2. The method of claim 1, wherein said electrical interconnect pattern comprises a leadframe type layout.

3. The method of claim 2, wherein said electrical interconnect pattern comprises a leadless leadframe type layout.

4. The method of claim 1, wherein said electrical interconnect pattern comprises a substantially consistent thickness of about 75 microns or less.

5. The method of claim 4, wherein said electrical interconnect pattern comprises a substantially consistent thickness of about 50 microns or less.

6. The method of claim 5, wherein said electrical interconnect pattern comprises a substantially consistent thickness of about 10 microns or less.

7. The method of claim 1, wherein said thin substrate is moved past said printing component using a reel to reel process.

8. The method of claim 1, wherein said metallic nanoink comprises a fluid having silver or copper particles from about 5 to 100 nanometers in diameter.

9. The method of claim 1, wherein said metallic nanoink comprises a fluid having a metallic percentage ranging from about 20 to 50 percent.

10. The method of claim 1, further including the steps of:
positioning said integrated circuit device against the metallic nanoink patterned side of said thin substrate;
providing a molded cap that encapsulates said integrated circuit device; and
removing said thin substrate from the integrated circuit device such that said metallic nanoink pattern remains on the integrated circuit device.

11. A method of manufacturing an electrical interconnect pattern for one or more integrated circuit devices, comprising:

designing a layout for said electrical interconnect pattern;

communicating said layout for said electrical interconnect pattern to an inkjet printer;

moving a thin substrate adapted for high temperature processing past a printing component of said inkjet printer;

dispensing a metallic nanoink from said inkjet printer onto said thin substrate in said layout for said electrical interconnect pattern as the thin substrate moves past said printing component; and curing said metallic nanoink such that a liquid component is driven therefrom and such that said substantially metallic residual electrical interconnect pattern remains on said thin substrate, wherein said electrical interconnect pattern is part of a panel containing multiple and separate arrays covered by a molded cap and having multiple packages each, wherein said molded cap is of substantially uniform thickness over each separate array of multiple packages, and wherein said molded cap extends between each separate array of multiple packages.

12. The method of claim 11, wherein said electrical interconnect pattern comprises a leadframe having a substantially consistent thickness of about 50 microns or less.

13. The method of claim 11, wherein said thin substrate is moved past said printing component using a reel to reel process.

* * * * *